US010209635B2

(12) United States Patent
Kochersperger et al.

(10) Patent No.: US 10,209,635 B2
(45) Date of Patent: Feb. 19, 2019

(54) LITHOGRAPHIC APPARATUS WITH A PATTERNING DEVICE ENVIRONMENT

(71) Applicant: ASML Holding N.V., Veldhoven (NL)

(72) Inventors: Peter Kochersperger, Easton, CT (US); David Ramirez, Danbury, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 15/537,293

(22) PCT Filed: Dec. 7, 2015

(86) PCT No.: PCT/EP2015/078849
§ 371 (c)(1),
(2) Date: Jun. 16, 2017

(87) PCT Pub. No.: WO2016/107718
PCT Pub. Date: Jul. 7, 2016

(65) Prior Publication Data
US 2017/0363975 A1    Dec. 21, 2017

Related U.S. Application Data

(60) Provisional application No. 62/098,777, filed on Dec. 31, 2014.

(51) Int. Cl.
*G03F 7/20* (2006.01)
(52) U.S. Cl.
CPC .......... *G03F 7/70933* (2013.01); *G03F 7/702* (2013.01); *G03F 7/70066* (2013.01); *G03F 7/70866* (2013.01)

(58) Field of Classification Search
CPC ............. G03F 7/70066; G03F 7/70866; G03F 7/70933
(Continued)

(56) References Cited

U.S. PATENT DOCUMENTS 7,030,959 B2   4/2006  Sogard
7,202,934 B2   4/2007  Moors et al.
(Continued)

FOREIGN PATENT DOCUMENTS

CN    102707574    10/2012
JP    2010-501999   1/2010
(Continued)

OTHER PUBLICATIONS

International Search Report and Written Opinion dated Apr. 25, 2016 in corresponding International Patent Application No. PCT/EP2015/078849.
(Continued)

*Primary Examiner* — Colin Kreutzer
(74) *Attorney, Agent, or Firm* — Pillsbury Winthrop Shaw Pittman LLP

(57) ABSTRACT

A lithographic apparatus injects gas between a patterning device and a patterning device masking blade to help protect the patterning device from contamination. The gas may be injected into the space defined between the patterning device and the patterning device blade by one or more gas supply nozzles that are arranged on at least one side of the patterning device. The one or more gas supply nozzles are coupled to a frame which a patterning device support structure moves relative to. Each nozzle may be constructed and arranged to supply gas over at least the patterning region of the reflective patterning device.

30 Claims, 12 Drawing Sheets

(58) Field of Classification Search
USPC .................. 355/30, 45, 71, 75; 359/509
See application file for complete search history.

(56) References Cited

U.S. PATENT DOCUMENTS

| | | | |
|---|---|---|---|
| 7,554,648 B2 | 6/2009 | Sogard | |
| 7,745,079 B2 | 6/2010 | Coon | |
| 8,368,868 B2 | 2/2013 | Vermeulen et al. | |
| 9,081,311 B2 | 7/2015 | Vogel et al. | |
| 2002/0057425 A1 | 5/2002 | Nakano | |
| 2002/0145711 A1* | 10/2002 | Magome | G03F 7/70858 355/30 |
| 2005/0206860 A1* | 9/2005 | Hof | G03B 27/52 355/30 |
| 2005/0248744 A1* | 11/2005 | Shibazaki | G03F 7/70716 355/72 |
| 2006/0017895 A1* | 1/2006 | Sogard | G03F 7/70875 355/30 |
| 2006/0131682 A1 | 6/2006 | Moors et al. | |
| 2007/0103656 A1* | 5/2007 | Sogard | G03B 27/52 355/30 |
| 2007/0285632 A1 | 12/2007 | Phillips et al. | |
| 2009/0207394 A1* | 8/2009 | Shibazaki | G03F 7/707 355/53 |
| 2010/0159399 A1 | 6/2010 | Vermeulen et al. | |
| 2011/0037960 A1 | 2/2011 | Scaccabarozzi et al. | |
| 2012/0249983 A1 | 10/2012 | Vogel et al. | |
| 2015/0049323 A1* | 2/2015 | Bal | G03F 7/70866 355/75 |
| 2015/0355557 A1* | 12/2015 | Cuypers | G03F 7/70358 355/72 |

FOREIGN PATENT DOCUMENTS

| | | |
|---|---|---|
| JP | 2011-519156 | 6/2011 |
| JP | 2012-209555 | 10/2012 |
| KR | 10-2012-0110069 | 10/2012 |
| TW | 201344374 | 11/2013 |
| WO | 2013/135494 | 9/2013 |
| WO | 2014/128232 | 8/2014 |

OTHER PUBLICATIONS

Chinese Office Action dated Jan. 29, 2018 in corresponding Chinese Patent Application No. 201580071512.X.
Japanese Office Action issued in corresponding Japanese Patent Application No. 2017-530011, dated Jun. 19, 2018.
Korean Office Action issued in corresponding Korean Patent Application No. 10-2017-7020245, dated Sep. 21, 2018.
Chinese Office Action issued in corresponding Chinese Patent Application No. 201580071512.X, dated Nov. 1, 2018.

* cited by examiner

LITHOGRAPHIC APPARATUS WITH A PATTERNING DEVICE ENVIRONMENT

CROSS-REFERENCE TO RELATED APPLICATIONS

This application is the U.S. national phase entry of PCT patent application no. PCT/EP2015/078849, which was filed on Dec. 7, 2015, which claims the benefit of priority of U.S. provisional patent application No. 62/098,777, which was filed on Dec. 31, 2014, and which is incorporated herein in its entirety by reference.

FIELD

The present disclosure relates to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system configured to produce EUV radiation may include a laser to excite a fuel to provide the plasma, and a source collector module to contain the plasma. The plasma may be created, for example, by directing a laser beam at a fuel, such as droplets of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

SUMMARY

An issue in an EUV lithographic apparatus is contamination of the patterning device (e.g., reticle/mask). In an EUV lithographic apparatus, a purge gas may flow at high speed towards the patterning device and may carry molecules and particles up to micrometer size. A transparent membrane pellicle may be provided to protect the patterning device, but it has a disadvantage of relatively high EUV absorption by the pellice. Molecular contamination of the patterning device can be addressed by cleaning processes involving hydrogen radicals. However, this may not address particle contamination and does not help to prevent contamination in the first place. Molecular contamination of the projection and illumination optics may be prevented or reduced by purging their vacuum environments with clean hydrogen gas. Typically, this results in a flow of hydrogen gas along the optical path towards the patterning device. This flow may carry particles that can subsequently contaminate the patterning device. Another technique may be to use a drag force induced by a gas temperature gradient generated via thermophoresis but this is less desirable as the patterning device has to be heated. Generally, existing techniques may not effectively or completely remove the possibility of particle contamination from the patterning device blades and other components located between the gas injection points and the patterning device and may induce other problems such as patterning device deformation due to a temperature gradient or a gas fluctuation disturbing the EUV radiation intensity.

One or more mirrors used in an EUV optical system are at risk for transmission loss due to exposure due to contamination from, e.g., outgassing of various construction materials and substrate photoresist. To help mitigate this risk, a low level of gas flow may be used to purge one or more parts of the optical system. This gas flow transports particles from the optical system (e.g., projection optics and/or illuminator) to the patterning device stage and deposits them on the patterning device. An illuminator top sleeve (ITS) that provides a gas flow may be introduced to help reduce contamination in an optical system into some machines. The ITS may reduce particle transfer from the projection optic system to the patterning device, but increases the transfer of particles from the illumination uniformity correction module (UNICOM), one or more patterning device blades (REMA), and/or one or more surrounding structures to the patterning device.

According to one aspect of this disclosure there is provided a lithographic apparatus including a support structure constructed and arranged to support a reflective patterning device. The reflective patterning device is configured to impart an illumination beam with a pattern to form a patterned radiation beam. The apparatus also includes a projection system constructed and arranged to receive the patterned radiation beam reflected by the reflective patterning device and configured to project the patterned radiation beam onto a substrate, a frame, the support structure being movable relative to the frame; and a gas supply nozzle coupled to the frame and constructed and arranged to supply gas therefrom. The gas supply nozzle is arranged to supply gas from a side of a patterning region of the reflective patterning device.

According to another aspect of the disclosure there is provided a method including: supporting a reflective patterning device with a support structure, the reflective patterning device configured to impart an illumination beam with a pattern to form a patterned radiation beam; patterning the illumination beam with the reflective patterning device, projecting the patterned radiation beam from the reflective patterning device onto a substrate with a projection system, and supplying a gas via a gas supply nozzle coupled to a frame, the support structure being movable relative to the frame. The gas is supplied from the gas supply nozzle from a side of a patterning region of the reflective patterning device.

According to another aspect of this disclosure there is provided a lithographic apparatus including a support structure constructed and arranged to support a reflective patterning device. The reflective patterning device is configured to impart an illumination beam with a pattern to form a patterned radiation beam. The apparatus also includes a projection system constructed and arranged to receive the patterned radiation beam reflected by the reflective patterning device and configured to project the patterned beam onto a substrate, a frame, the support structure being movable relative to the frame; and a plurality of gas supply nozzles coupled to the frame and constructed and arranged to supply gas therefrom. The plurality of gas supply nozzles are arranged such that at least one of the plurality of gas supply nozzles is on one side of a patterning region of the reflective patterning device and another of the plurality of gas supply nozzles is on an opposite side of the of the patterning region.

Features and/or advantages of embodiments of the disclosure, as well as the structure and operation of various embodiments of the disclosure, are described in detail herein with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the disclosure will now be described, by way of example only, with reference to the accompanying drawings in which.

Figure 1:
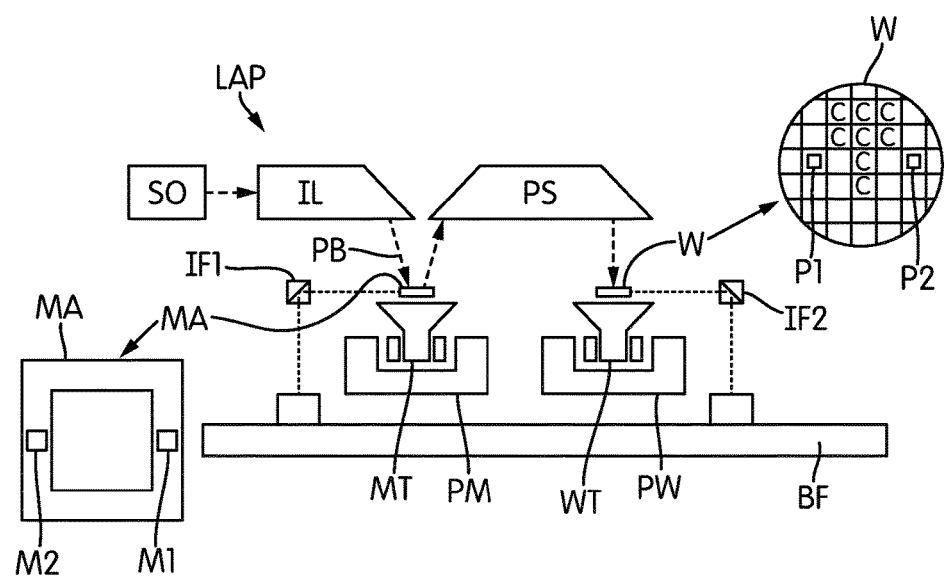
FIG. 1 schematically depicts a lithographic apparatus according to an embodiment of the disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF EXEMPLARY EMBODIMENTS

This specification discloses one or more embodiments that incorporate the features of this disclosure. The disclosed embodiment(s) merely exemplify the disclosure. The scope of the disclosure is not limited to the disclosed embodiment(s). The disclosure is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with one or more other embodiments whether or not explicitly described.

Before describing embodiments in more detail, however, it is instructive to present an example environment in which embodiments of the disclosure may be implemented.

FIG. 1 schematically shows a lithographic apparatus LAP including a source collector module SO according to an embodiment of the disclosure. The apparatus comprises: an illumination system (illuminator) IL configured to condition a radiation beam PB (e.g., EUV radiation); a support structure (e.g., a mask table) MT constructed and arranged to support a reflective patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam PB by patterning device MA onto a target portion C (e.g., comprising one or more dies) of the substrate W. Also shown in FIG. 1 is a base frame BF which may be mounted to a floor. The positioners PM and/or PW may be supported by the base frame BF.

The illumination system may include various types of optical components, such as refractive, reflective, magnetic, electromagnetic, electrostatic or other types of optical components, or any combination thereof, for directing, shaping, or controlling radiation.

The support structure MT comprises a part for receiving and holding the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" or "reflective patterning device" should be broadly interpreted as referring to any device that can be used to impart a radiation bream or an illumination beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum vessel and vacuum pumps.

As here depicted, the apparatus is of a reflective type, i.e., employing a reflective mask and reflective optics in the illuminator IL and projection system PS.

The lithographic apparatus may be of a type having two (dual stage) or more tables (e.g., two or more substrate tables, two or more patterning device tables, a substrate table and a measurement table, etc.). In such "multiple stage" machines the additional tables may be used in parallel, or preparatory steps may be carried out on one or more tables while one or more other tables are being used for exposure.

Referring to FIG. 1, in an embodiment, the illuminator IL receives an EUV radiation beam from the EUV source SO. Methods to produce EUV radiation include, but are not necessarily limited to, converting a material into a plasma state that has at least one chemical element, e.g., xenon, lithium, or tin, with one or more emission lines in the EUV range. In one such method, often termed laser-produced plasma ("LPP"), the plasma can be produced by irradiating a fuel, such as a droplet of material having the required line-emitting element, with a laser beam. The EUV source SO may be part of an EUV radiation source including a laser, not shown in FIG. 1, configured to provide the laser beam exciting the fuel. The resulting plasma emits output radiation, e.g., EUV radiation, which is collected using a radiation collector, disposed in the EUV source.

The laser and the EUV source may be separate entities, for example when a $CO_2$ laser is used to provide the laser beam for fuel excitation. In such cases, the radiation beam is passed from the laser to the EUV source with the aid of a beam delivery system comprising, for example, suitable directing mirrors and/or a beam expander. The laser and a fuel supply may be considered to comprise an EUV radiation source.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam PB is incident on the reflective patterning device (e.g., mask) MA, which is held on the support structure (e.g., mask table, or reticle stage) MT, and is patterned by the patterning device. The patterning device MA may be positioned using first positioning device such as interferometer IF1 and patterning device alignment marks M1, M2. After being reflected from the patterning device (e.g., mask) MA, the patterned radiation beam PB passes through the projection system PS, which focuses the beam onto a target portion C of the substrate W. With the aid of the second positioning device such as interferometer IF2 and substrate alignment marks P1, P2 (e.g., using interferometric devices, linear encoders or capacitive sensors), the substrate table WT can be moved accurately, e.g., so as to position different target portions C in the path of the radiation beam PB.

The depicted apparatus could be used in at least one of the following modes:

1. In step mode, the support structure (e.g., mask table or reticle stage) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-) magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Figure 2:
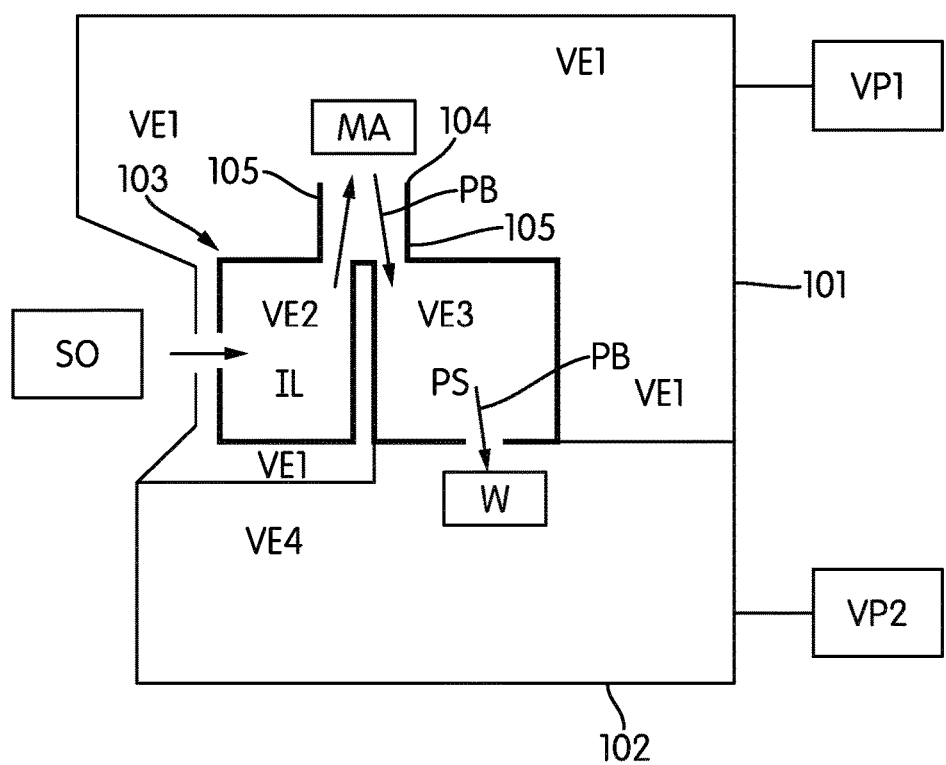
FIG. 2 is a schematic view of an embodiment showing in particular pressure zones of a lithographic apparatus.

FIG. 2 schematically shows an apparatus according to an embodiment of the disclosure. The apparatus of FIG. 2 includes a first chamber 101 that contains an illumination system IL as well as a projection system PS. The illumination system IL is configured to condition a radiation beam received from source SO, and the projection system PS is configured to project a patterned radiation beam PB onto a target portion of a substrate W. First chamber 101 also contains a patterning device support constructed to support the patterning device MA, the patterning device MA being capable of imparting a radiation beam with a pattern in its cross-section to form the patterned radiation beam. A second chamber 102 contains the substrate table of which for clarity only the substrate W is shown.

FIG. 2 shows how the apparatus may be divided into four different vacuum environments VE1 to VE4. First chamber 101 defines a first vacuum environment VE1 that encloses the patterning device stage of which for clarity only the patterning device MA is shown. First chamber 101 also includes a separator construction 103 that defines two further vacuum environments: VE2 housing the illumination system IL, and VE3 housing the projection system PS. Vacuum environments VE2 and VE3 could be further divided. Separator construction 103 includes a sleeve 105 having an aperture 104 for passing the projection beam PB from the illumination system IL to patterning device MA, and for passing the patterned radiation beam from patterning device MA to the projection system PS. The sleeve 105 also serves to force the gas flow downwards (i.e., away from the patterning device) and to maintain generally even gas flow to avoid disturbance of the EUV radiation intensity. Possibly the sleeve may taper towards the patterning device MA. Second chamber 102 defines a vacuum environment VE4 that the substrate table (of which for clarity only substrate W is shown). Vacuum environments VE1 and VE2 are formed and maintained by respective vacuum vessels and vacuum pumps VP1 and VP2, which can also be a plurality of vacuum pumps.

As is shown in FIG. 2, in an embodiment, vacuum pump VP1 maintains vacuum environment VE1 at a lower pressure than vacuum environments VE2 and VE3. Clean gas (e.g., hydrogen, helium, nitrogen, oxygen or argon) may be injected into vacuum environments VE2 and VE3 using gas injectors (not shown). The vacuum pumps VP1, VP2 as such are known to the skilled person, and may be coupled to the apparatus in various ways.

The separator construction 103 can be arranged in various ways, and may include, for example, a sleeve 105 extending towards the patterning device MA at the end of which sleeve 105 is provided the projection beam aperture 104 which extends towards the patterning device MA. In this embodiment, the sleeve 105 bearing the aperture 104 may have a tapered cross-section.

Figure 4:
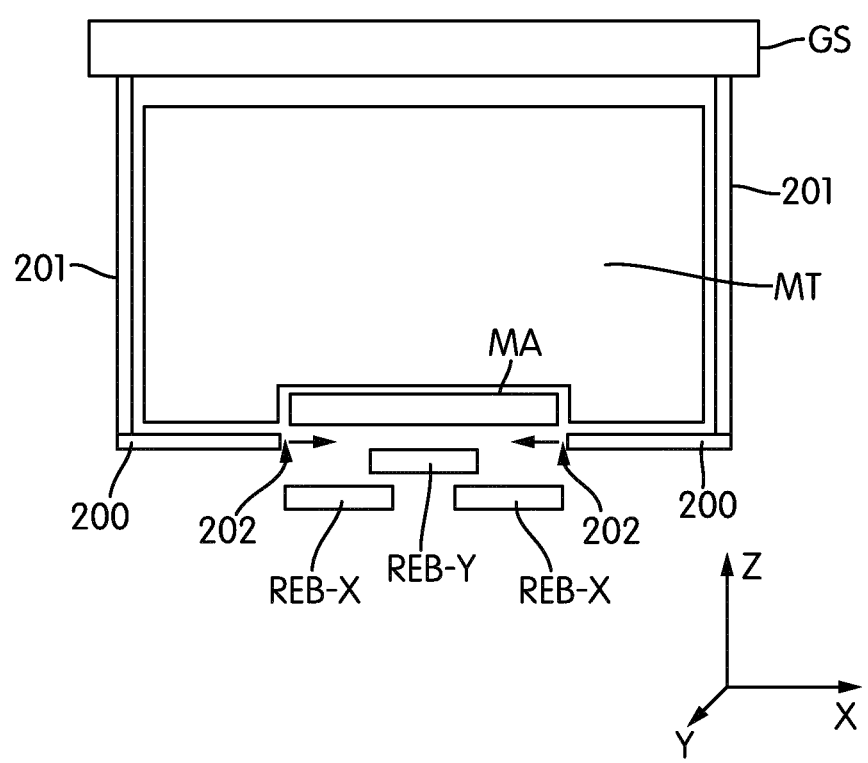
FIG. 4 shows a further side view detail of the embodiment of FIG. 2 showing the patterning device assembly and one or more masking blades according to an embodiment of the disclosure in side view.
Figure 15:
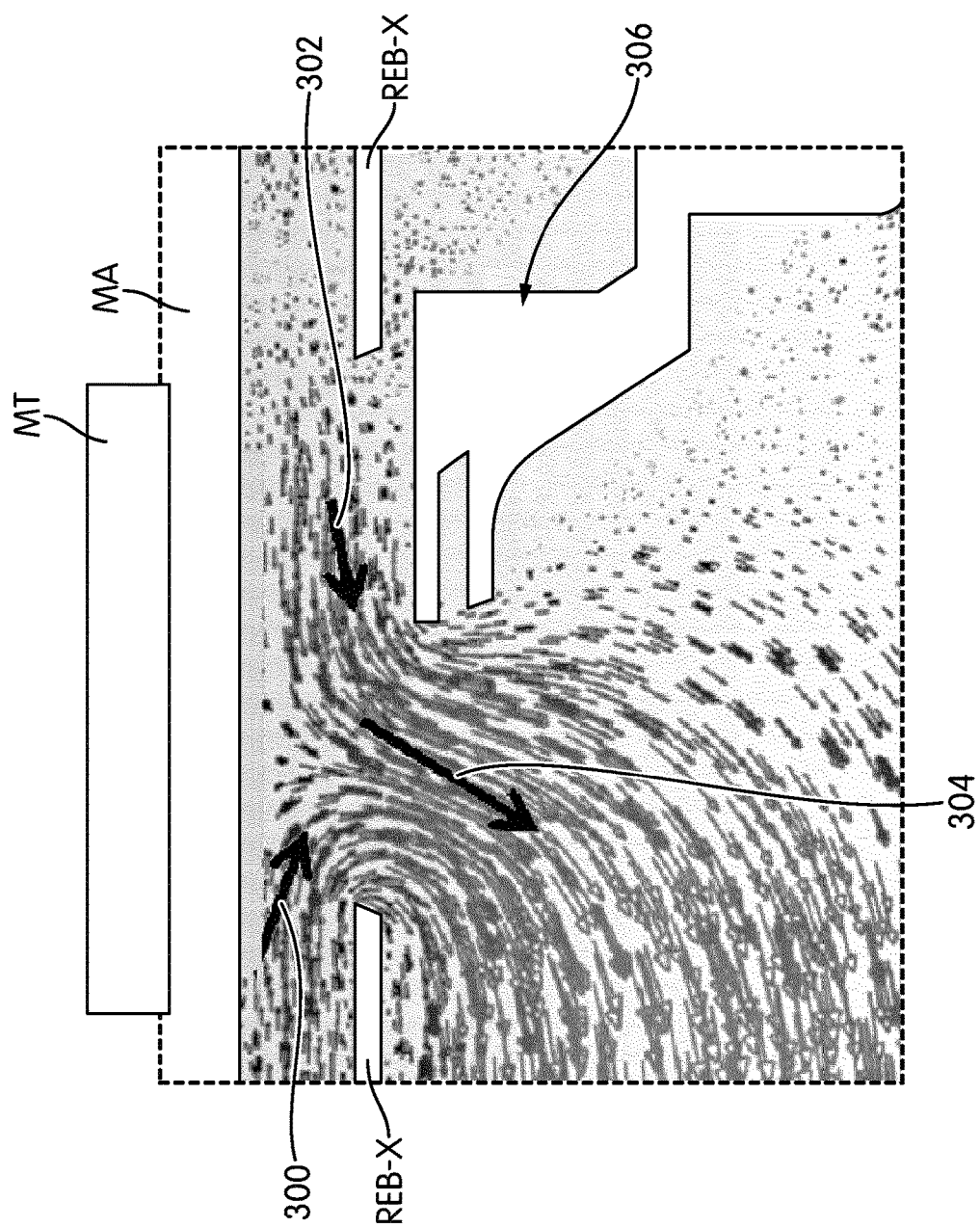
FIG. 15 shows a gas flow diagram of outlet gas from the gas supply nozzles shown in FIGS. 5 and 14.

In an embodiment, the apparatus also includes a radiation beam shaping device. In an embodiment, the radiation beam shaping device comprises at least one patterning device masking blade REB (REMA) configured to control a lateral dimension of the projection beam PB. In an embodiment, a plurality of masking blades are provided, each masking blade provided in the path of the illumination beam. As shown in FIG. 4, multiple blades REB may be provided and extend at least partially between the reflective patterning device MA and the aperture 104 of the separator construction 103 during use. Each patterning device masking blade REB is spaced from the patterning device MA so as to define a space between the at least one patterning device masking blade and the patterning device MA. In front of (e.g. below) the patterning device masking blade REB, there may be an illumination uniformity correction module (UNICOM) 306, as shown in FIG. 15, for example. The illumination uniformity correction module may comprise a sensor and/or one or more elements to facilitate illumination uniformity correction. An illuminator top sleeve (ITS) may also be included in the apparatus to reduce particle transfer from the optics to the patterning device, which is also shown in FIG. 15. The UNICOM 306 is positioned below the blades REB, in accordance with an embodiment. In an embodiment, the ITS is positioned below both of the UNICOM 306 and the blades REB.

Figure 3:
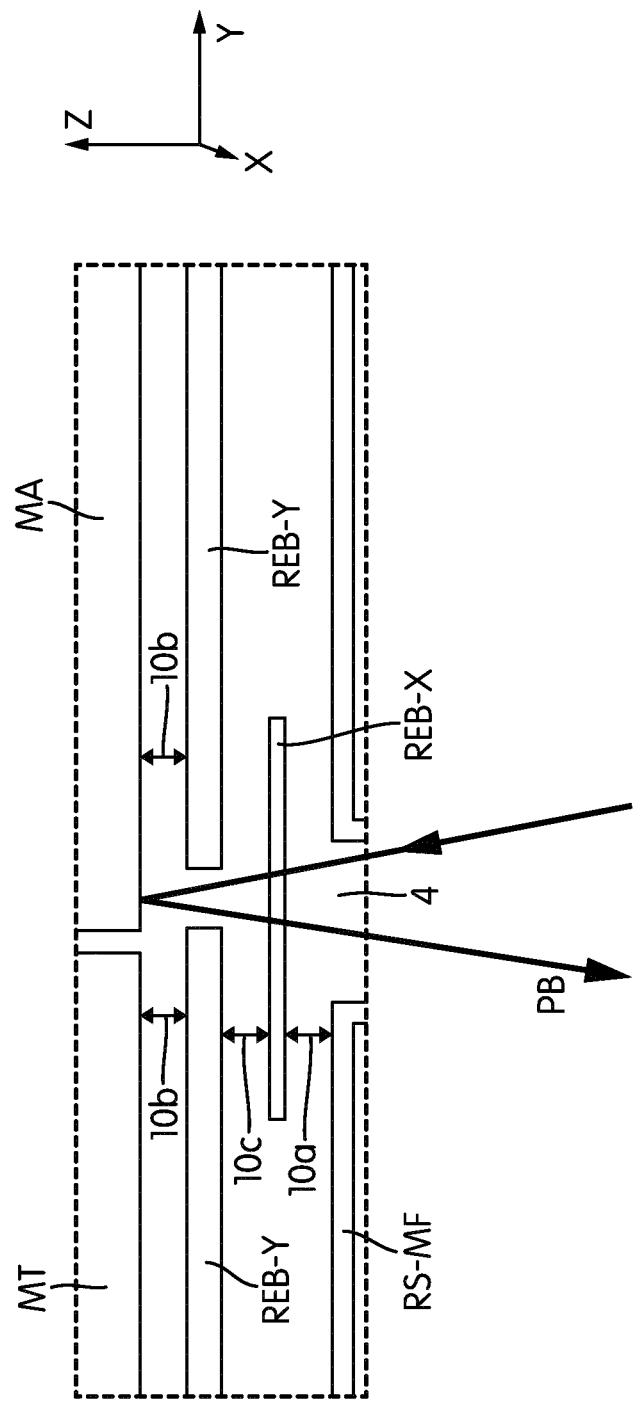
FIG. 3 shows in side view a detail of the embodiment of FIG. 2.

FIG. 3 schematically shows the patterning device table MT holding the reflective patterning device MA and blades REB-X and blades REB-Y which are located near the patterning device MA to control the shape of the projection beam in the X and Y directions, respectively. In the illustrated embodiment, the Y-blades REB-Y are positioned nearer to the patterning device MA than the X-blades REB-X, when viewed in the Z-direction but of course the blades could be arranged the other way around. A patterning device stage frame RS-MF is provided with an aperture 4 to allow the radiation beam to reach and be reflected by the patterning device MA. In an embodiment, the patterning device stage frame RS-MF may support one or more sensors.

The X-blades REB-X are located at a small distance 10a from the projection beam aperture 4 measured in the Z-direction. This last-mentioned distance may be not more than about 5 mm, or not more than about 2 mm.

Also, the Y-blades REB-Y are located at small distances 10b from the patterning device MA. This last-mentioned distance may also be not more than about 5 mm, measured in the Z-direction.

The smallest distance 10c between the X-blades and Y-blades may be about 5 mm, when measured in the Z-direction.

Figure 5:
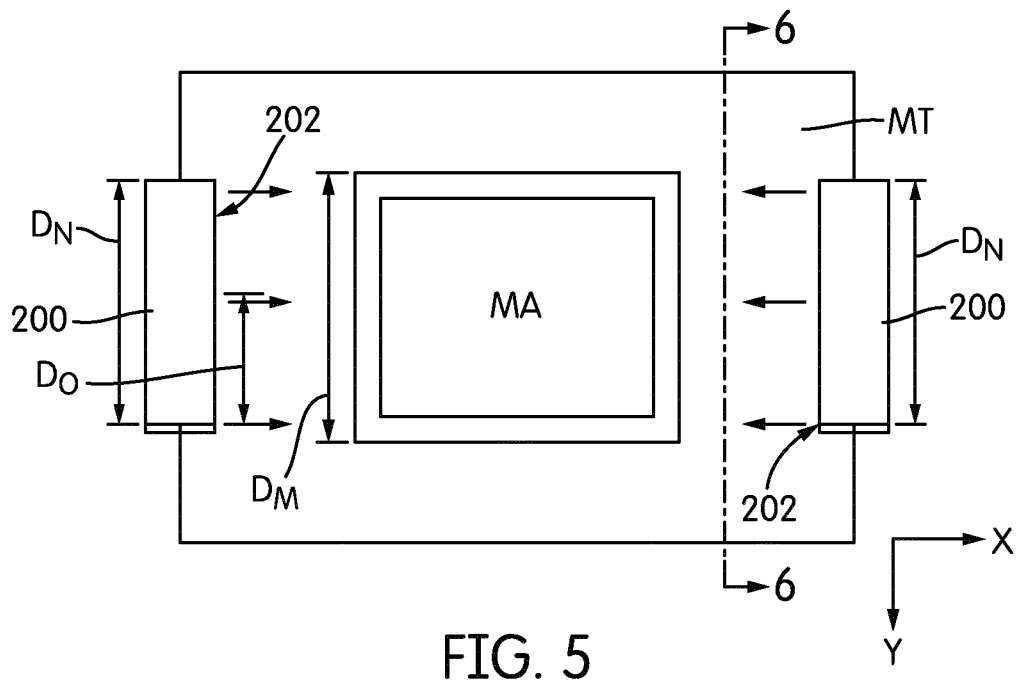
FIG. 5 shows the patterning device assembly and one or more gas supply nozzles according to an embodiment in plan view.

FIGS. 4 and 5 show respectively schematic side and plan views of the patterning device assembly in more detail. As shown in FIG. 4, in one embodiment, one or more gas supply nozzles 200 are connected via one or more connectors 201 to a gas supply GS and are constructed and arranged to supply gas delivered from the gas supply GS. In an embodiment, a plurality of gas nozzles is provided. At least one of the gas nozzles 200 may be arranged on one side of the patterning device MA. In an embodiment, at least one of the gas nozzles 200 is arranged on one side of the patterning device MA and at least another of the gas nozzles is arranged on an opposite side of the patterning device MA. That is, in an embodiment, the gas supply nozzles 200 are arranged such that at least one of the plurality of gas supply nozzles is on one side of a patterning region of the reflective patterning device and at least another of the plurality of gas supply nozzles is on an opposite side of the of the patterning region. The gas supply nozzles 200 are configured to supply gas to the space between the at least one patterning device masking blade REB and the patterning device. However, it should be understood that the use of two (or more) gas supply nozzles 200 in such a configuration is not intended to be limiting. In accordance with an embodiment, a single gas supply nozzle may be provided with the patterning device assembly and/or lithographic apparatus, and may be coupled to the frame and constructed and arranged to supply gas from at least one side of a patterning region of the reflective patterning device.

In the illustrative embodiment of FIG. 4, the gas nozzles 200 are provided either side of the patterning device MA and are arranged such that gas (in particular, hydrogen, helium, nitrogen, oxygen or argon) may be injected in a direction generally parallel to the surface of the patterning device MA, in the direction of the arrows in the figure, and substantially to and in the space between the patterning device MA and the blades REB-X, REB-Y. In an embodiment, the nozzles 200 extend horizontally relative to the support structure MT and are constructed and arranged to supply gas to the space in a direction generally parallel to the surface of the patterning device MA. The gas supply nozzles 200 may be provided above the at least one patterning device masking blade REB, as shown in FIG. 4, for example.

Figure 6:
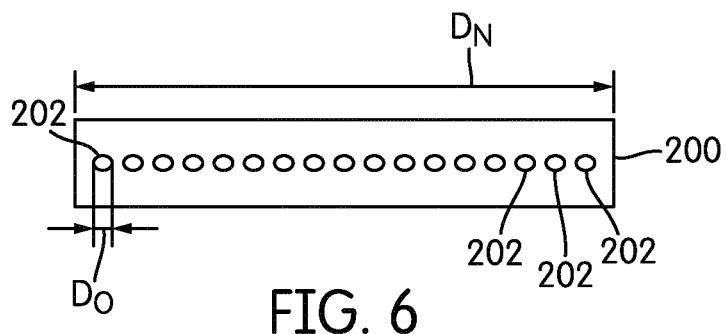
FIG. 6 shows a cross sectional view taken along line 6-6 of FIG. 5 of a gas supply nozzle in accordance with an embodiment.

As represented by the arrows in FIGS. 4 and 5, for example, an outlet opening 202 of each nozzle 200 may be positioned towards the patterning device MA to supply gas towards the patterning device MA and patterning device blades REB. Each nozzle 200, as shown in FIGS. 5 and 6, which extends laterally relative to the patterning device MA, has at least one outlet opening 202. The outlet opening(s) 202 of the gas supply nozzles 200 is desirably oriented towards the patterning device surface, for example generally horizontally (i.e., in the X-Y plane).

In an embodiment, each nozzle 200 is constructed and arranged to supply gas over at least half of the patterning region of the reflective patterning device MA. For example, the gas may be supplied over at least half of the length of the patterning region. In another embodiment, each nozzle 200 is constructed and arranged to supply gas over substantially the entire patterning region, or scan region, of the reflective patterning device MA. In an embodiment, each nozzle 200 is constructed and arranged to supply gas over an area that is larger than the patterning region of the reflective patterning device MA. In an embodiment, where the patterning device MA is moved in scanning motion, each nozzle 200 is constructed and arranged to supply gas over substantially the entire scan region of the reflective patterning device MA.

Each nozzle includes a lateral dimension DN (e.g., length or width) or span that is substantially equal to or larger than a dimension DM of the patterning region of the reflective patterning device MA, as shown in FIG. 5, for example. The outlet opening(s) 202 includes a dimension DO (e.g., diameter) to output supplied gas towards the patterning device MA and patterning device blades REMA. In an embodiment, DN=DM. In an embodiment, DN>=DM. In an embodiment, DN>DM. In an embodiment, DO>=DM/2. In an embodiment, DO>=DM. In an embodiment, DO>DM.

The size of the outlet opening(s) 202 may vary. In one embodiment, each nozzle 200 comprises multiple outlet openings 202 extending laterally along the nozzle 200 and relative to the patterning region of the reflective patterning device. FIG. 6 illustrates an example in accordance with an embodiment of multiple outlet openings 202 extending across a span of the nozzle 200. The amount, position, size, and configuration of the openings 202 as shown on the nozzle 200 in FIG. 6 is not intended to be limiting, however. Each opening 202 has a dimension DO to output and supply gas towards the patterning region of the patterning device MA and to adjacent the blades REB. The gas output from the openings 202 may be constructed and arranged to supply gas over at least half of the patterning region (DM) of the reflective patterning device MA. In another embodiment, the openings 202 are constructed and arranged to supply gas over substantially an entire patterning region (DM) of the reflective patterning device MA. In another embodiment, gas is supplied by openings 202 over an area that is larger than the patterning region of the reflective patterning device MA.

Figure 7:
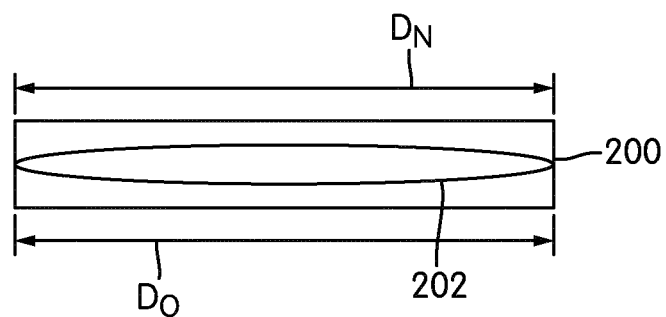
FIG. 7 shows an alternate cross sectional view taken along line 6-6 of FIG. 5 of a gas supply nozzle in accordance with another embodiment.

In another embodiment, each nozzle 200 comprises a single outlet opening 202 extending laterally along the nozzle 200 and relative to the patterning region of the reflective patterning device MA. FIG. 7 illustrates an example in accordance with an embodiment of a single outlet opening 202 extending across the span of the nozzle 200 with its dimension DO continuously extending substantially across the span of the nozzle 200, to output and supply gas towards the patterning region of the patterning device MA and adjacent the blades REB. In an embodiment, DN=DO. In another embodiment, DN is greater than or equal to DO. In an embodiment, DN is greater than DO. The position, size, and configuration of the opening 202 as shown on the nozzle 200 in FIG. 7, however, is not intended to be limiting.

The gas output from the opening 202 may be constructed and arranged to supply gas over at least half of the patterning region (DM) of the reflective patterning device MA. In another embodiment, the opening 202 is constructed and arranged to supply gas over substantially an entire patterning region (DM) of the reflective patterning device MA. In yet another embodiment, gas is supplied by opening 202 over an area that is larger than the patterning region of the reflective patterning device MA.

The gas supply nozzles 200 are coupled to a frame in the lithographic apparatus. The support structure MT is movable relative to the frame. That is, the gas supply nozzles 200 are uncoupled from the support structure MT. This enables the support structure MT to move relative to the nozzles 200, and/or vice versa.

In an embodiment, the gas supply nozzles 200 are coupled to a separate frame (not shown in FIG. 5). In an embodiment, the frame to which the gas supply nozzles 200 are coupled is the patterning device stage metrology frame RS-MF. In an embodiment, the gas supply nozzles 200 are coupled to the base frame BF. In an embodiment, the gas supply nozzles 200 are mechanically isolated from a frame holding the projection system PS and/or holding one more sensors. Mechanical isolation comprises substantially preventing vibrations from the nozzles reaching the frame holding the projection system PS and/or holding one more sensors.

Figure 8:
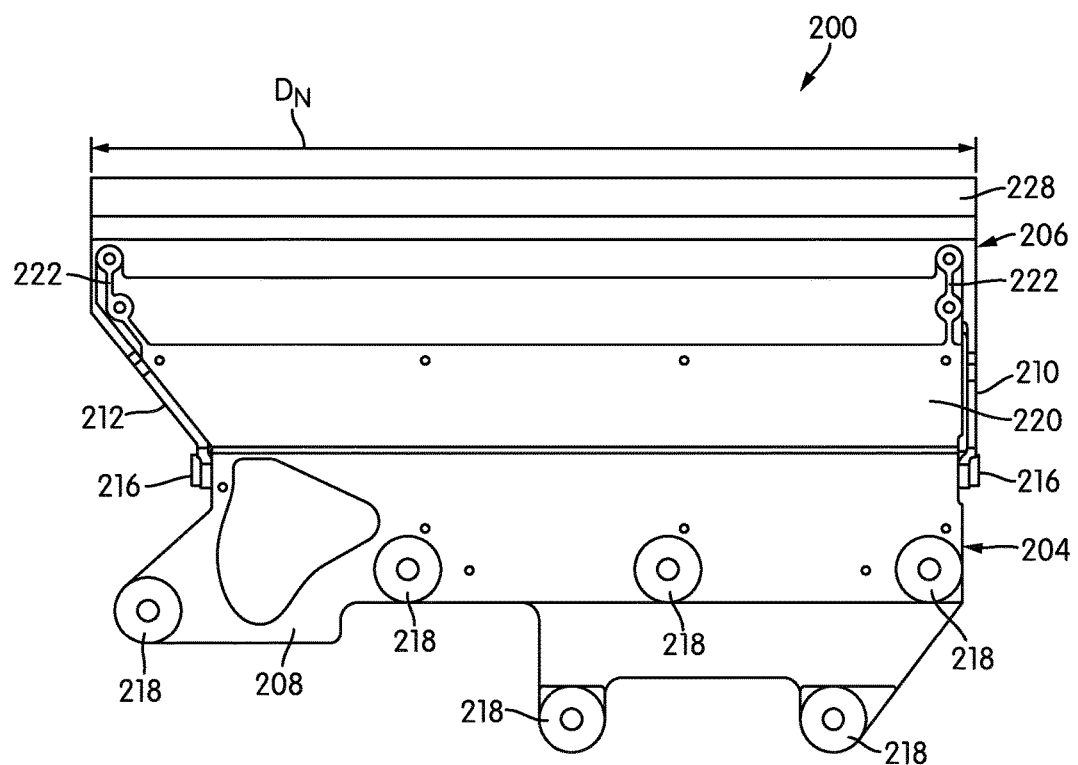
FIGS. 8 and 9 show a top and side view respective of a gas supply nozzle in accordance with an embodiment.
Figure 9:
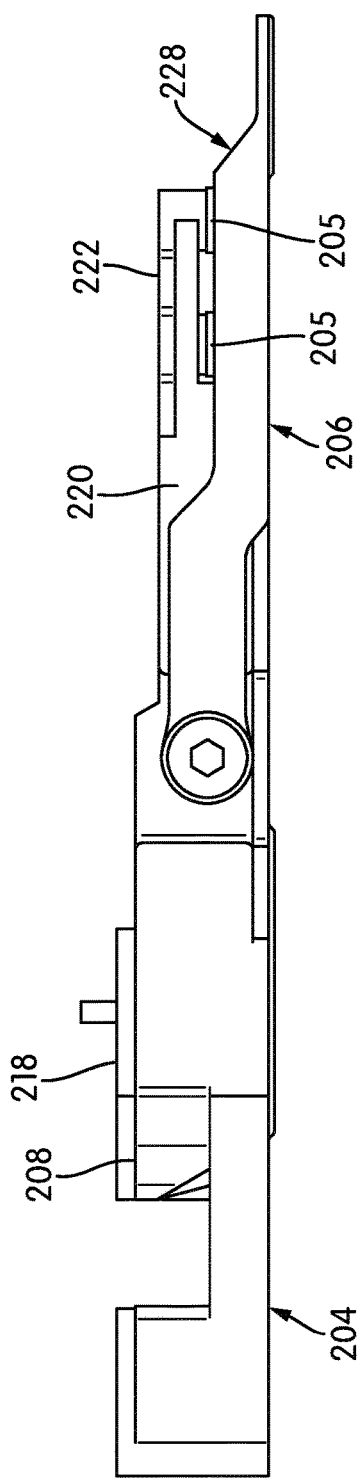

FIGS. 8-13 illustrate a further embodiment of a configuration of a gas supply nozzle 200 that may be used to supply gas from a side of a patterning region of the reflective patterning device. As seen in FIGS. 8 and 9, the gas supply nozzle 200 includes a nozzle body 204 connected to a nozzle tip 206. The nozzle body 204 may include a mounting surface portion 208 and a front connection portion 220. The mounting surface portion 208 may contact the structure (e.g., frame) that the nozzle 200 is mounted to, and may be used to control the position of the nozzle relative to the patterning device stage MT (e.g., to maintain position tolerances and/or avoid collision). The mounting surface portion 208 may include one or more attachment mechanisms 218, such as extending pins, along its body to connect to the structure (e.g., frame) of the apparatus. The front connection portion 220 of the nozzle body 204 connects to, and in some cases overlaps, the nozzle tip 206, as shown in FIG. 9, for example. The front connection portion 220 includes one or more connectors 222 for attachment to one or more corresponding bosses 205 (e.g., see FIGS. 10 and 11) of the nozzle tip 206. The nozzle tip 206 also includes a first arm 210 and a second arm 212 for attachment to the nozzle body 204. The first and second arms 210 and 212 are secured to connection pin portions 216 (see FIG. 8) provided on either size of the nozzle body 204 via pivot holes 214 (see FIG. 10) provided in one end of each of the arms 210 and 212. In the illustrated embodiment, the arms 210 and 212 have different configurations, e.g., the first and second arms 210 and 212 extend at different angles relative to the design of the front connection portion 220 of the nozzle body 204. However, this configuration, as shown, for the nozzle body 204 and first and second arms 210 and 212 is not intended to be limiting.

Figure 10:
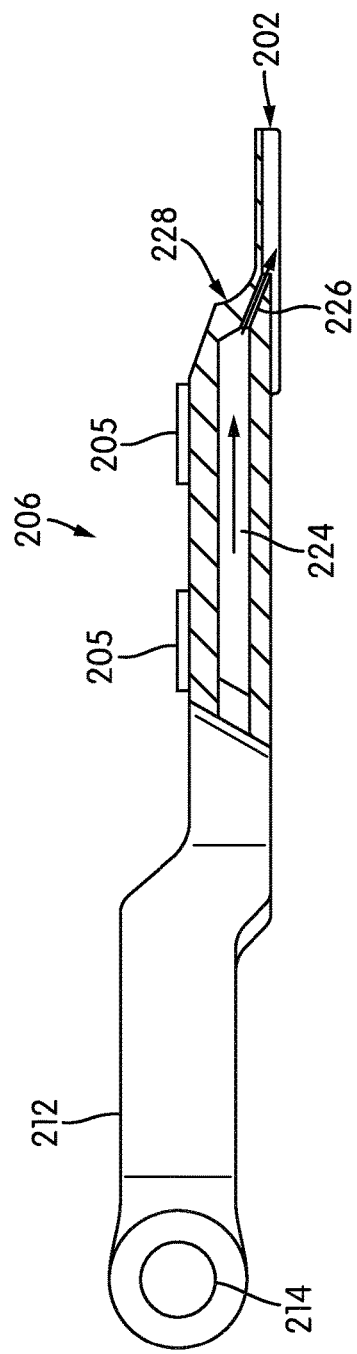
FIG. 10 illustrates a cross sectional view of a nozzle tip of the gas supply nozzle of FIG. 8 as taken along line 10-10 in FIG. 11.
Figure 12:
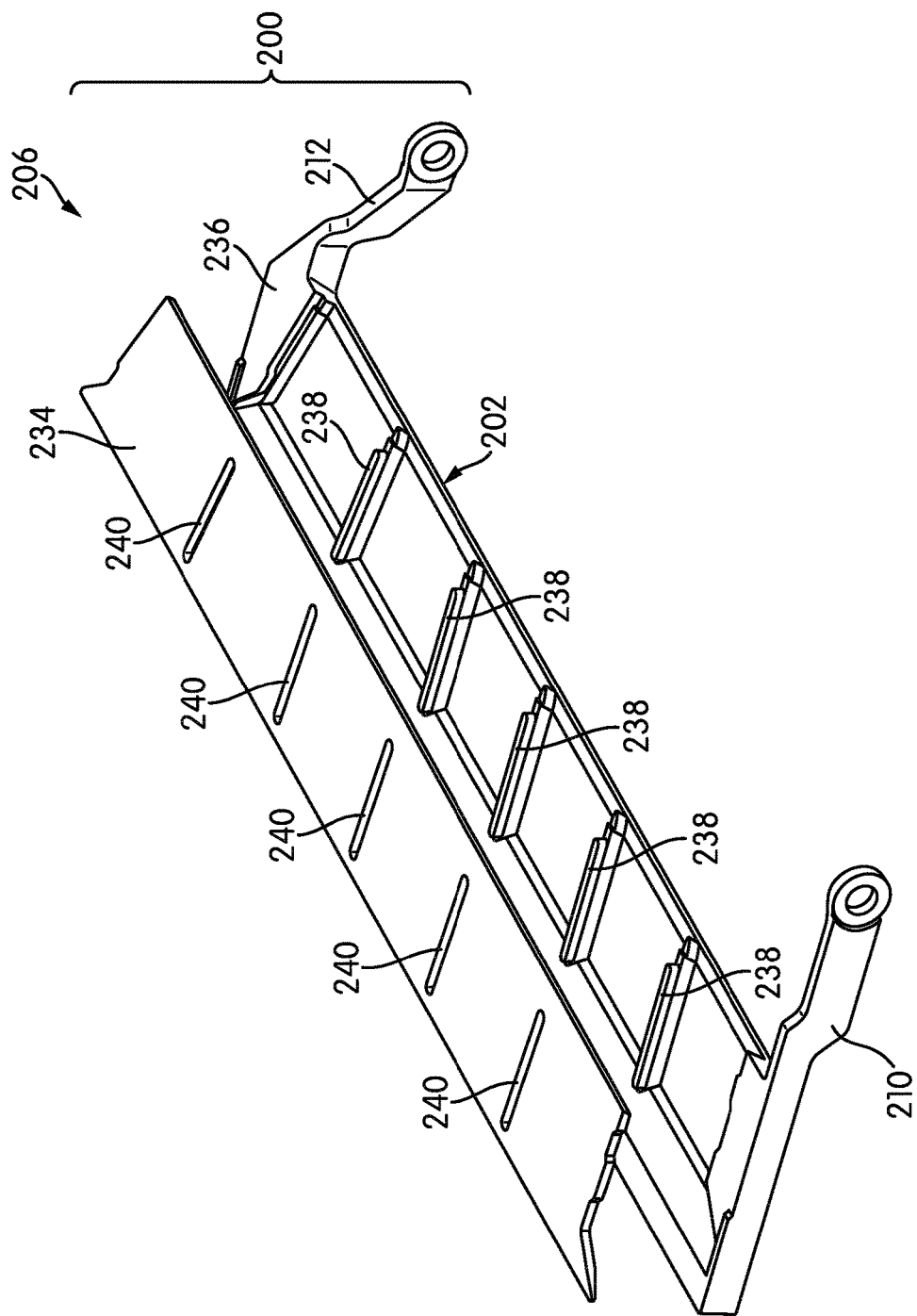
FIG. 12 shows an exploded view of parts of the nozzle tip of the gas supply nozzle of FIG. 8.
Figure 13:
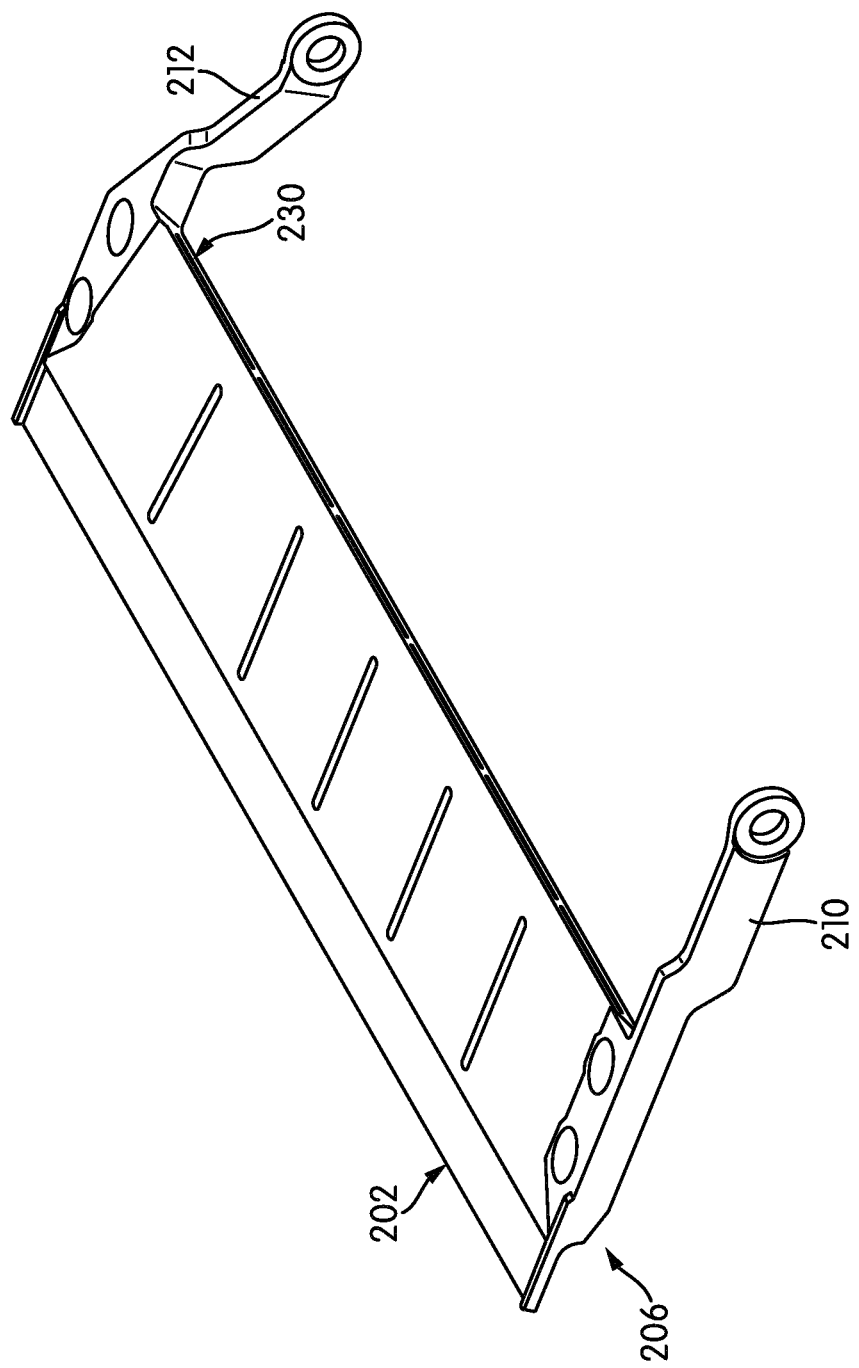
FIG. 13 shows a combined view of the parts of FIG. 12 when assembled.

As shown in FIG. 10, the nozzle tip 206 includes a chamber 224 and an edge portion 228 with at least one gas exit slit 226 therein to direct supplied gas through and towards the patterning device MA (the arrows represent the flow of gas through the nozzle tip 206). In the illustrated embodiment, the gas exit slit 226 extends across the lateral span of the nozzle tip 204. The gas exit slit 226 may also be positioned at an angle within the edge portion 228. The gas exit slit 226 may be directed at a downward angle relative to the horizontal plane of the nozzle 200, for example. The edge portion 228 may extend outwardly from the chamber 224 and slit 226 and serve as a baffle to direct gas that is supplied through the gas exit slit 226 of the opening 202 (e.g., in a downward direction away the patterning device MA). As shown in the exploded view of FIG. 12, one or more stiffening ribs 238 may be provided perpendicularly relative to the lateral span of the gas exit slit 226 at the end of the nozzle tip 204. More particularly, FIG. 12 shows that the nozzle tip 206 may be formed from a first part 234 (e.g., a cover) and a second part 236. The second part 236 may include a series of generally parallel, spaced apart ribs 238 that are equally or sporadically spaced along the span of the second part 236. The first part 234 may include one or more openings 240 or connecting areas that are designed to connect with the ribs 238 of the second part 236. The parts may be brazed or welded together, for example. FIG. 13 shows an example of the parts of FIG. 12 as assembled. The amount, position, size, and configuration of the spaced apart stiffening ribs 238 within the nozzle tip 206 and/or the gas exit slit 226 as shown on the nozzle 200 in FIG. 10 or FIG. 12 is not intended to be limiting, however.

The nozzle body 204 serves as a plenum chamber to equalize pressure for more even distribution across the nozzle exit slit 226 in each nozzle tip 204. This provides a substantially uniform gas flow across the gas exit slit 226. The series of generally parallel, spaced apart ribs 238 within the nozzle tip 206 may direct and pressurize the gas as it is supplied through the chamber 224 and into and through the gas exit slit 226 of the tip 206.

Figure 11:
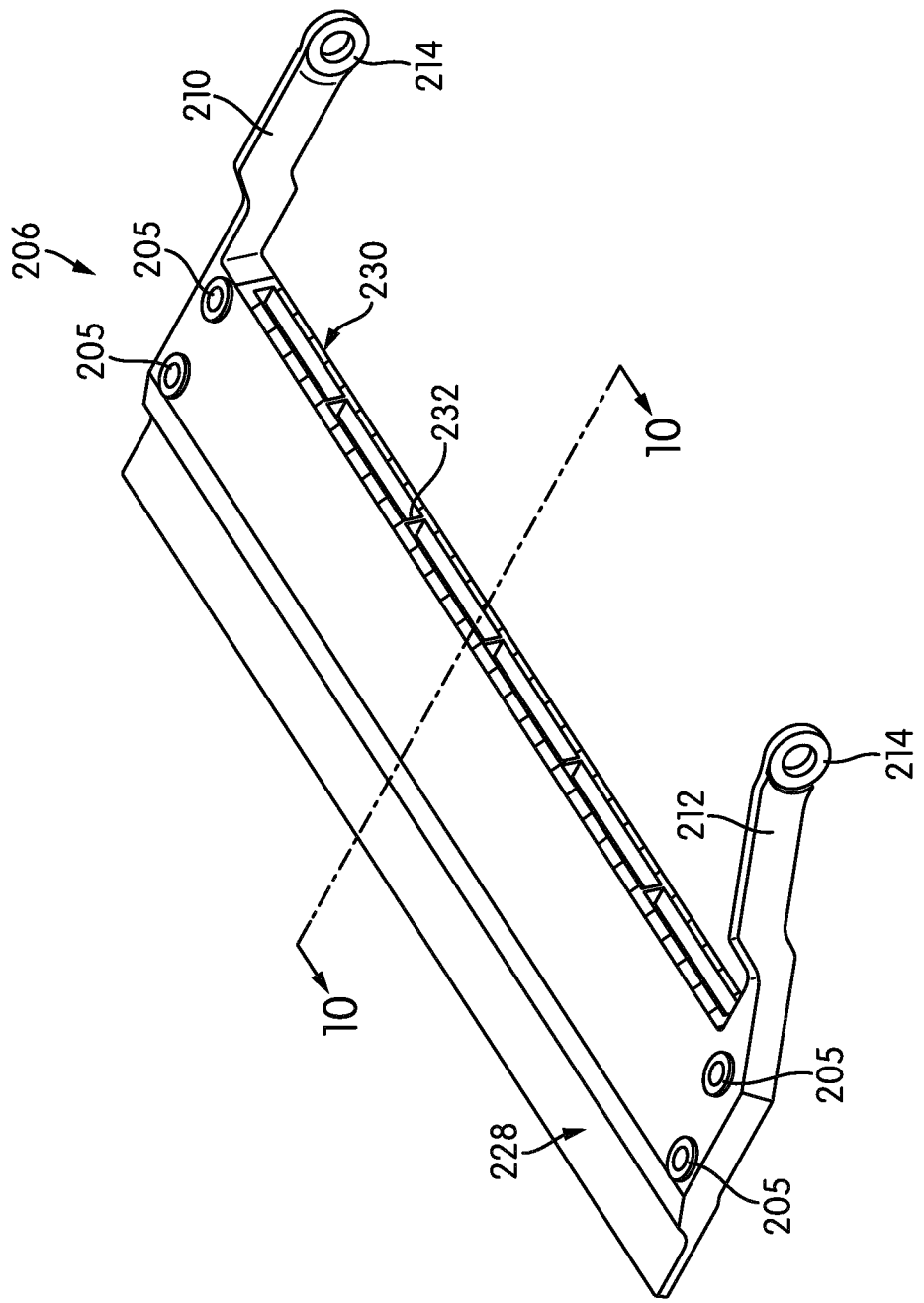
FIG. 11 shows a perspective view of the nozzle tip of the gas supply nozzle of FIG. 8.

The gas interface between the nozzle body 204 and the nozzle tip 206 may include a seal 230 (e.g., no O-ring interface) matched in shape and size on both sides of the angled (metal-to-metal) contact interface of the nozzle body 204 and nozzle tip 206. FIG. 11 shows an example of a seal 230 provided at a contact interface, e.g., provided on the nozzle tip 206, although a seal may additionally or alternatively be provided on a nozzle body 204. The seal 230 may include portions 232 that correspond to and align with ribs 238. At this nozzle body/tip interface, the gas is channeled into the chamber 224 of the nozzle tip 206, containing spaced-apart ribs 238 which guide the flow to the exit slit 226.

Each nozzle includes a lateral dimension DN (e.g., length or width) or span, as shown in FIG. 8, which is substantially equal to or larger than a dimension DM of the patterning region of the reflective patterning device or patterning device MA, as shown in FIG. 5, for example. The gas exit slit 226 of the outlet opening 202 include a lateral dimension (e.g., length) to output supplied gas towards the patterning device MA and blades REMA. The gas output from the slit 226 may be constructed and arranged to supply gas over at least half of the patterning region (DM) of the reflective patterning device MA. In another embodiment, the slit 226 is constructed and arranged to supply gas over substantially an entire patterning region (DM) of the reflective patterning device MA. In another embodiment, gas is supplied via slit 226 over an area that is larger than the patterning region of the reflective patterning device MA. In an embodiment, the lateral dimension may be defined as the total dimension along the lateral direction of the nozzle tip 206 through which the gas is supplied. In an embodiment, the dimension of the gas exit slit 226 is equal to, or greater than or equal to, DN. In an embodiment, the dimension of the gas exit slit 226 is equal to, or greater than or equal to, DM. In another embodiment, the dimension of the gas exit slit 226 is greater than DM.

In one embodiment, the lateral dimension of the gas exit slit 226 is approximately 289 millimeters (mm). In an embodiment, the lateral dimension DN of the nozzle is approximately 289 millimeters (mm).

In an embodiment, the lateral dimension of the gas exit slit 226 may be defined as a dimension between adjacent, lateral stiffening ribs. The total of all of the lateral dimensions measured between the stiffening ribs may be equal to, or greater than or equal to, DN. In an embodiment, the total of all of the lateral dimensions of the gas exit slit 226 is equal to, or greater than or equal to, DM. In another embodiment, the total of all of the lateral dimensions of the gas exit slit 226 is greater than DM.

The gas exit slit 226 of the outlet opening 202 also includes a thickness dimension to output supplied gas towards the patterning device and blades REMA. In an embodiment, the thickness of the gas exit slit 226 is between approximately 0.6 and approximately 1.0 millimeters (mm), inclusive. In another embodiment, the thickness of the gas exit slit 226 is approximately 0.8 mm. However, such dimensions of the slit 226 are exemplary only and not intended to be limiting.

The angle at which the gas exit slit 226 is designed to direct output gas is not intended to be limiting. In accordance with an embodiment, the angle at which the gas exit slit 226 is positioned is approximately 20 degrees relative to a horizontal plane.

When using nozzles as disclosed herein, such as the nozzle 200 illustratively shown in FIGS. 8-13, gas from the gas supply GS is expanded through the nozzle opening(s) 202 and released below the patterning device MA. The gas may be controlled by its own constraints (pressure, volume, etc.). Further, the nozzles may be designed to spread the gas (e.g., in the Y-direction) via a plenum-like designed chamber 224, and expanded through the nozzle tip 206 via gas exit slit 226.

The gas output from the gas exit slit 226 of the opening 202 may be constructed and arranged to supply gas over at least half of the patterning region (DM) of the reflective patterning device MA. In another embodiment, the gas exit slit 226 is constructed and arranged to supply gas over substantially an entire patterning region (DM) of the reflective patterning device MA. In another embodiment, gas is supplied by gas exit slit 226 over an area that is larger than the patterning region of the reflective patterning device MA.

Figure 14:
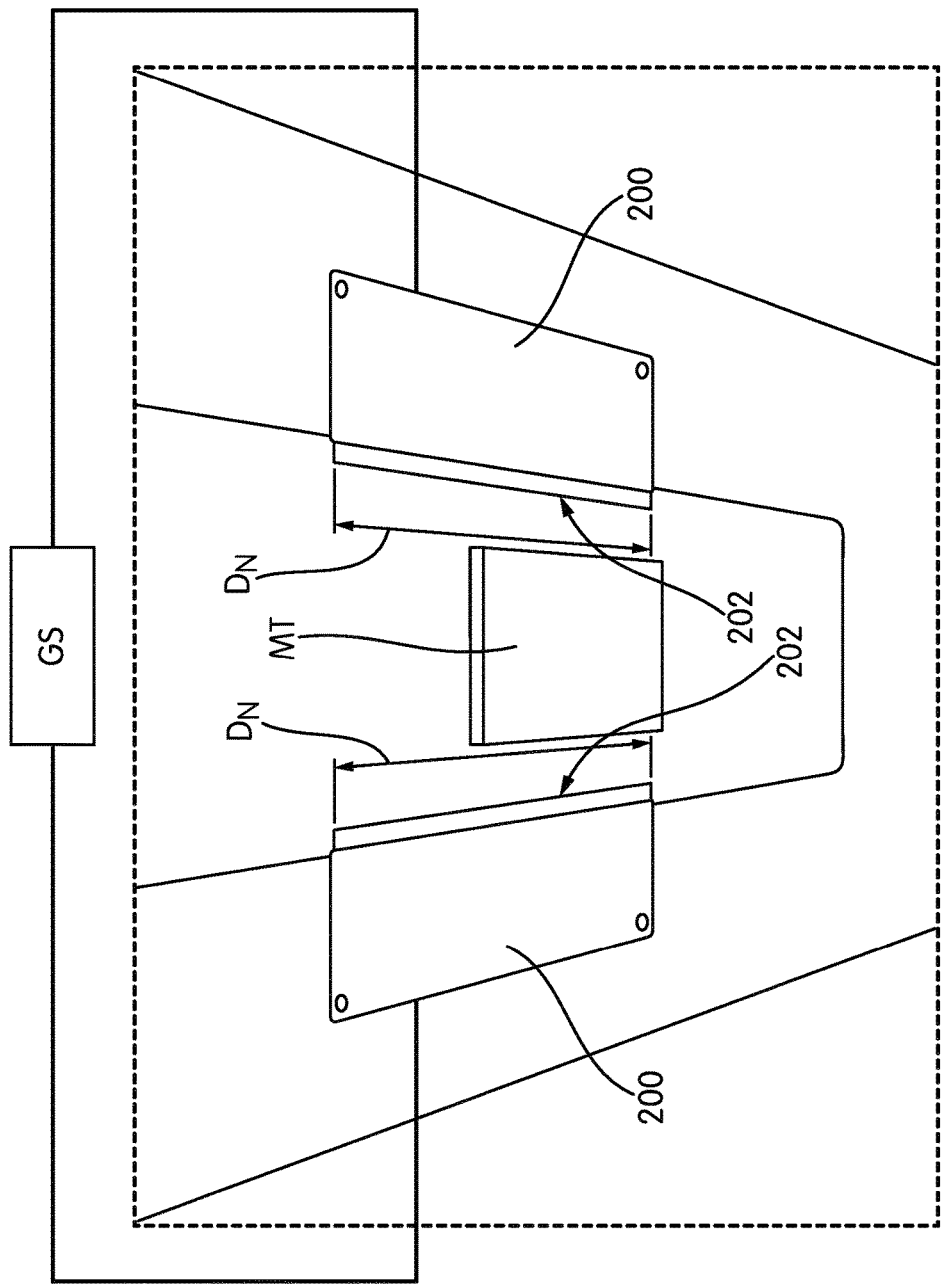
FIG. 14 shows an upward view of gas supply nozzles and a patterning device assembly in a lithographic apparatus of the type of FIG. 1 according to an embodiment.

The gas supply nozzles 200 according to the embodiment illustrated in FIGS. 8-13 may be coupled to a frame in the lithographic apparatus. FIG. 14 shows an upward view of an exemplary embodiment with gas supply nozzles 200 and a patterning device assembly MT in a lithographic apparatus of the type of FIG. 1, for example. The support structure MT is movable relative to the frame. That is, the gas supply nozzles 200 are uncoupled from the support structure MT. This enables the support structure MT to move relative to the nozzles 200, and/or vice versa.

In an embodiment, the gas supply nozzles 200 as shown in FIGS. 8-13 are coupled to a separate frame (not shown). In another embodiment, the frame in which the gas supply nozzles 200 are coupled to is the patterning device stage frame RS-MF. In another embodiment, the gas supply nozzles 200 are coupled to the base frame BF.

The above exemplary designs and configurations of nozzles as discussed with respect to FIGS. 5-13 are not intended to limit the design or configuration of the nozzles used to supply gas towards the patterning device MA.

In accordance with an embodiment, the nozzles 200 are designed to inject gas on either side of the patterning device scanning path to have clean gas flow between the patterning device front side and the REB blades. Specifically, each nozzle 200, positioned on at least either side, is designed and configured to point towards a center or a middle of the patterning region of the patterning device MA so that gas may be output towards a center or a middle of the patterning region of the patterning device MA. Gas may be output or injected from the outlet opening(s) 202 of the nozzles 200 in the X direction (as shown in the Figures) or in the Y direction. The gas is injected between the blades that are closest to the patterning device (in this case the REB-Y blades), into the space, but could be injected between the REB-Y and the REB-X blades. By injecting gas close to the patterning device surface and in particular into the confined space between the patterning device surface and the blades REB, the possibility of contamination from components (such as the blades themselves and other components) is substantially reduced.

As illustratively shown in FIG. 15, two paths 300 and 302 of gas (e.g., hydrogen, helium, nitrogen, oxygen or argon) flow laterally from the nozzles 200 provided on at least the opposite sides of the patterning region, in a generally parallel manner, across the patterning device MA and blades REB-X. The paths 300 and 302 meet near the center of the patterning device MA, combine, and then diverge away from the patterning device MA as shown by 304, in a downward direction, past the UNICOM 306 and towards the ITS. In an embodiment, the gas flow injected from the nozzles 200 never points directly toward the patterning device MA. Rather, it may start moving laterally or generally parallel relative to the patterning device MA and support structure MT, and then turns to flow away from the patterning device MA, as shown. In this way, particles in the gas flow are less likely to land on the front side of the patterning device MA. The ability to deposit particles on the patterning device, accordingly, is reduced.

A method of using the herein disclosed lithographic apparatus LAP thus includes: supporting a reflective patterning device MA with a support structure, the reflective patterning device MA being configured to impart an illumination beam with a pattern to form a patterned radiation beam PB; patterning the illumination beam with the reflective patterning device MA, projecting the patterned beam from the reflective patterning device onto a substrate with a projection system PS, and supplying a gas in a direction generally parallel to the surface of the reflective patterning device MA via one or more gas supply nozzles 200. In an embodiment, the gas is supplied from a plurality of gas supply nozzles, with respective nozzles on opposite sides of the reflective patterning device MA. That is, in an embodiment, at least one of the plurality of gas supply nozzles is on one side of a patterning region of the reflective patterning device and at least another of the plurality of gas supply nozzles is on an opposite side of the of the patterning region.

Although the drawings and description above generally show and describe the system utilizing more than one nozzle, it is still within the scope of this disclosure that a single nozzle may be implemented and used in a lithographic apparatus to supply gas. According to one aspect of this disclosure, there is provided a lithographic apparatus including a support structure constructed and arranged to support a reflective patterning device. The reflective patterning device is configured to impart an illumination beam with a pattern to form a patterned radiation beam. The apparatus also includes a projection system constructed and arranged to receive the patterned radiation beam reflected by the reflective patterning device and configured to project the patterned radiation beam onto a substrate, and a frame, wherein the support structure is movable relative to the frame. In an embodiment, at least one gas supply nozzle is coupled to the frame and constructed and arranged to supply gas therefrom. The at least one gas supply nozzle is arranged to supply gas from at least one side of a patterning region of the reflective patterning device.

Further, then, it should be understood that this disclosure provides a method including: supplying a gas in a direction generally parallel to the surface of the reflective patterning device via at least one gas supply nozzle. The gas is supplied from the at least one gas supply nozzle (as noted above) from at least one side of a patterning region of the reflective patterning device.

As such, the herein disclosed configuration of nozzle(s) 200 is advantageous since it may reduce the likelihood of particles being deposited on the patterning device. The gas flow may pass minimal hardware before reaching the patterning device front side, so that opportunity for the gas flow to become contaminated is reduced or minimized. Thus, cleaner gas may be provided in front of the patterning device MA. Accordingly, the configuration of nozzles herein may reduce the contamination of the front of the patterning device during exposure and reduce patterning device front side defectivity.

It may be advantageous to help ensure that outgassing from the patterning device MA does not result in the generation of excessive amounts of molecular contaminants that may be carried through into the illuminator IL and the projection system PS since some of the gas supplied via the conduits may flow into the illuminator (IL) and into the projection system (PS).

It may be advantageous to provide the support structure configured to hold the patterning device in a partially enclosed environment, at least in the vicinity of the confined space between the patterning device surface and the blades.

In such a configuration, even more effective gas transport towards the projection optics compartment may be achieved due to the pressure created in the partially enclosed environment.

In order to reduce or minimize the possibility of particle contamination of the patterning device MA it may be designed and implemented such that the pressure at the patterning device MA is higher than in both VE2 and VE3 so that there is a downward flow from patterning device MA into VE2 and VE3. This may be achieved by balancing the flow rates that are injected into the different environments, i.e., the flow rates of the gas injections into VE2 and VE3 and the gas injected from the nozzles 200, for example. Also, it may be desirable to have a high flow resistance from the patterning device MA into the remainder of VE1, and this may be obtained by providing a flow resistance device between the patterning device MA and the environment VE1 such that the gas conductance between the patterning device MA and the environment VE1 is no more than 10 m/s, no more than 5 m/s, or no more than 2 m/s.

Implementations of such a flow resistance include extending a top surface of the separator in the X-Y plane generally parallel to the patterning device MA, extending the surface of the patterning device support structure MT in the X-Y plane, or forming one or more protrusions on at least some of the patterning device blades REB such protrusions extending in the Z-direction (i.e., towards or away from the patterning device MA, or both).

Combinations and/or variations on the above described modes of use or entirely different modes of use may also be employed.

Although the above embodiments where described in connection with a lithographic apparatus, the same concept may also be used for other types of apparatus, such as a metrology apparatus or an inspection apparatus configured to measure one or more properties of a surface, for example to measure one or more properties of a surface of a patterned substrate. Such a metrology or inspection apparatus may comprise for example several of the following elements: an optical system arranged to condition a property of a radiation beam used to illuminate a structure to be analyzed, a support structure comprising a part constructed to support the structure to be analyzed, a radiation beam shaping device configured to shape the radiation beam, the radiation beam shaping device being adjacent the support structure, and a plurality of gas supply nozzles constructed and arranged to supply gas to a space defined between the part of the support structure constructed to support the structure to be analyzed and the radiation beam shaping device, and a processor arrange to analyze the detected radiation. In an embodiment, each nozzle has an outlet that extends laterally relative to the structure to be analyzed and has a continuous length that is constructed and arranged to at least supply gas over more than half of a length of the structure to be analysed supported by the support structure. A radiation source arranged to illuminate the structure to be analyzed may be provided as an integral part of the apparatus or as a separate component to be used together with the metrology or inspection apparatus.

Herein, a confined space may be a limited space which is defined between a) the part of the support structure constructed to support the patterning device, and b) the radiation shaping device. That is, a confined space may be a limited space between the patterning device and the radiation shaping device, such as the confined space between the surfaces of a patterning device MA supported by the support structure and of at least one of the masking blades.

In an embodiment, there is provided a lithographic apparatus comprising: a support structure constructed and arranged to support a reflective patterning device, the reflective patterning device configured to impart an illumination beam with a pattern to form a patterned radiation beam; a projection system constructed and arranged to receive the patterned radiation beam reflected by the reflective patterning device and configured to project the patterned radiation beam onto a substrate; a frame, the support structure being movable relative to the frame; and a gas supply nozzle coupled to the frame and constructed and arranged to supply gas therefrom, the gas supply nozzle arranged to supply gas from a side of a patterning region of the reflective patterning device.

In an embodiment, the lithographic apparatus further comprises a masking blade spaced from the patterning device, the masking blade provided in the path of the illumination beam, such that there is a space defined between the masking blade and the patterning device, and wherein the gas supply nozzle is configured to supply gas to the space. In an embodiment, the gas supply nozzle is above the masking blade. In an embodiment, the gas supply nozzle extends horizontally relative to the support structure and is constructed and arranged to supply gas to the space in a direction substantially parallel to the surface of the patterning device. In an embodiment, the lithographic apparatus comprises a plurality of gas supply nozzles coupled to the frame and constructed and arranged to supply gas therefrom, the plurality of gas supply nozzles arranged such that at least one of the plurality of gas supply nozzles is on the side of the patterning region of the reflective patterning device and at least another of the plurality of gas supply nozzles is on an opposite side of the patterning region. In an embodiment, the gas supply nozzle comprises a plurality of outlet openings extending laterally along the nozzle and relative to the patterning region of the reflective patterning device. In an embodiment, the gas supply nozzle comprises an outlet opening extending laterally along the nozzle and relative to the patterning region of the reflective patterning device. In an embodiment, the gas supply nozzle is constructed and arranged to supply gas over substantially the entire patterning region of the reflective patterning device. In an embodiment, the gas supply nozzle is constructed and arranged to supply gas over an area that is larger than the patterning region of the reflective patterning device. In an embodiment, the gas supply nozzle comprises a lateral dimension that is larger than the patterning region of the reflective patterning device. In an embodiment, the gas supply nozzle is uncoupled from the support structure such that the support structure is constructed and arranged to move relative to the gas supply nozzle. In an embodiment, the illumination beam is a radiation beam at an EUV wavelength. In an embodiment, the lithographic apparatus further comprises an illumination system constructed and arranged to condition the radiation beam at the EUV wavelength.

In an embodiment, there is provided a method comprising: supporting a reflective patterning device with a support structure, the reflective patterning device configured to impart an illumination beam with a pattern to form a patterned radiation beam; patterning the illumination beam with the reflective patterning device, projecting the patterned radiation beam from the reflective patterning device onto a substrate with a projection system, and supplying a gas via a gas supply nozzle, the gas supply nozzle coupled to a frame, the support structure being movable relative to the frame, wherein the gas is supplied from the gas supply nozzle from a side of a patterning region of the reflective patterning device.

In an embodiment, a patterning device masking blade is spaced from the patterning device and in the path of the illumination beam, such that a space is defined between the masking blade and the patterning device, and wherein the supplying the gas comprises supplying gas to the space. In an embodiment, the gas supply nozzle is above the masking blade, and wherein the supplying the gas to the space comprises supplying gas above the masking blade. In an embodiment, the supplying the gas comprises supplying the gas to the space in a direction substantially parallel to the surface of the patterning device. In an embodiment, the supplying the gas comprises supplying the gas via a plurality of gas supply nozzles, at least one of the plurality of gas supply nozzles being on one side of the patterning region of the reflective patterning device and at least another of the plurality of gas supply nozzles being on an opposite side of the patterning region. In an embodiment, the gas supply nozzle comprises a plurality of outlet openings extending laterally along the nozzle and relative to the patterning region of the reflective patterning device, and wherein the supplying the gas comprises supplying the gas through the plurality of outlet openings. In an embodiment, the gas supply nozzle comprises an outlet opening extending laterally along the nozzle and relative to the patterning region of the reflective patterning device, and wherein the supplying the gas comprises supplying the gas through the outlet opening. In an embodiment, the supplying the gas comprises supplying the gas over substantially the entire patterning region of the reflective patterning device. In an embodiment, the supplying the gas comprises supplying the gas over an area that is larger than the patterning region of the reflective patterning device. In an embodiment, the illumination beam is a radiation beam at an EUV wavelength.

In an embodiment, there is provided a lithographic apparatus comprising: a support structure constructed and arranged to support a reflective patterning device, the reflective patterning device configured to impart an illumination beam with a pattern to form a patterned radiation beam; a projection system constructed and arranged to receive the patterned radiation beam reflected by the reflective patterning device and configured to project the patterned radiation beam onto a substrate; a frame, the support structure being movable relative to the frame; and a plurality of gas supply nozzles coupled to the frame and constructed and arranged to supply gas therefrom, the plurality of gas supply nozzles arranged such that at least one of the plurality of gas supply nozzles is on one side of a patterning region of the reflective patterning device and at least another of the plurality of gas supply nozzles is on an opposite side of the patterning region.

In an embodiment, the lithographic apparatus further comprises a patterning device masking blade spaced from the patterning device and in the path of the illumination beam, such that a space is defined between the masking blade and the patterning device, and wherein the plurality of gas supply nozzles are configured to supply gas to the space. In an embodiment, the plurality of gas supply nozzles is above the masking blade. In an embodiment, each nozzle of the plurality of gas supply nozzles is constructed and arranged to supply gas over at least the entire patterning region of the reflective patterning device. In an embodiment, each nozzle of the plurality of gas supply nozzles comprises a lateral dimension that is larger than the patterning region of the reflective patterning device. In an embodiment, each of the plurality of gas supply nozzles are uncoupled from the support structure such that the support structure is constructed and arranged to move relative to the plurality of gas supply nozzles.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, LEDs, solar cells, photonic devices, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the disclosure have been described above, it will be appreciated that the disclosure may be practiced otherwise than as described. The descriptions above are intended to be illustrative, not limiting. Thus it will be apparent to one skilled in the art that modifications may be made to the disclosure as described without departing from the scope of the claims set out below.

The disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described exemplary embodiments, but should be defined only in accordance with the following claims and clauses and their equivalents.

What is claimed is:

1. A lithographic apparatus comprising:
a support structure constructed and arranged to support a reflective patterning device, the reflective patterning device configured to impart an illumination beam from an illumination system with a pattern to form a patterned radiation beam;
a projection system constructed and arranged to receive the patterned radiation beam reflected by the reflective patterning device and configured to project the patterned radiation beam onto a substrate;
a frame, the support structure being movable relative to the frame; and
a gas supply nozzle coupled to the frame and constructed and arranged to supply gas therefrom, the gas supply nozzle arranged to supply gas from a side of a patterning region of the reflective patterning device and the gas supply nozzle protruding into a gap between the projection system and the support structure and/or a gap between the illumination system and the support structure, wherein the gas supply nozzle is configured to be moved relative to the projection system and/or the illumination system.

2. The lithographic apparatus of claim 1, further comprising a masking blade spaced from the patterning device, the masking blade provided in the path of the illumination beam, such that there is a space defined between the masking blade and the patterning device, and
wherein the gas supply nozzle is configured to supply gas to the space.

3. The lithographic apparatus of claim 2, wherein the gas supply nozzle is above the masking blade.

4. The lithographic apparatus of claim 2, wherein the gas supply nozzle extends horizontally relative to the support structure and is constructed and arranged to supply gas to the space in a direction substantially parallel to the surface of the patterning device.

5. The lithographic apparatus of claim 1, comprising a plurality of gas supply nozzles coupled to the frame and constructed and arranged to supply gas therefrom, the plurality of gas supply nozzles arranged such that at least one of the plurality of gas supply nozzles is on the side of the patterning region of the reflective patterning device and at least another of the plurality of gas supply nozzles is on an opposite side of the patterning region.

6. The lithographic apparatus of claim 1, wherein the gas supply nozzle comprises a plurality of outlet openings extending laterally along the nozzle and relative to the patterning region of the reflective patterning device.

7. The lithographic apparatus of claim 1, wherein the gas supply nozzle comprises an outlet opening extending laterally along the nozzle and relative to the patterning region of the reflective patterning device.

8. The lithographic apparatus of claim 1, wherein the gas supply nozzle is constructed and arranged to supply gas over substantially the entire patterning region of the reflective patterning device.

9. The lithographic apparatus of claim 1, wherein the gas supply nozzle is constructed and arranged to supply gas over an area that is larger than the patterning region of the reflective patterning device.

10. The lithographic apparatus of claim 1, wherein the gas supply nozzle comprises a lateral dimension that is larger than the patterning region of the reflective patterning device.

11. The lithographic apparatus of claim 1, wherein the gas supply nozzle is uncoupled from the support structure such that the support structure is constructed and arranged to move relative to the gas supply nozzle.

12. The lithographic apparatus of claim 1, wherein the illumination beam is a radiation beam at an EUV wavelength.

13. A method comprising:
moving a gas supply nozzle relative to a projection system and/or an illumination system;
supporting a reflective patterning device with a support structure, the reflective patterning device configured to impart an illumination beam from the illumination system with a pattern to form a patterned radiation beam;
patterning the illumination beam with the reflective patterning device,
projecting the patterned radiation beam from the reflective patterning device onto a substrate with the projection system, and
supplying a gas via the gas supply nozzle, the gas supply nozzle coupled to a frame, the support structure being movable relative to the frame, and the gas supply nozzle protruding into a gap between the projection system and the support structure and/or a gap between the illumination system and the support structure,
wherein the gas is supplied from the gas supply nozzle from a side of a patterning region of the reflective patterning device.

14. The method of claim 13, wherein a patterning device masking blade is spaced from the patterning device and in the path of the illumination beam, such that a space is defined between the masking blade and the patterning device, and
wherein the supplying the gas comprises supplying gas to the space.

15. The method of claim 14, wherein the gas supply nozzle is above the masking blade, and wherein the supplying the gas to the space comprises supplying gas above the masking blade.

16. The method of claim 14, wherein the supplying the gas comprises supplying the gas to the space in a direction substantially parallel to the surface of the patterning device.

17. The method of claim 13, wherein the supplying the gas comprises supplying the gas via a plurality of gas supply nozzles, at least one of the plurality of gas supply nozzles being on one side of the patterning region of the reflective patterning device and at least another of the plurality of gas supply nozzles being on an opposite side of the patterning region.

18. The method of claim 13, wherein the gas supply nozzle comprises a plurality of outlet openings extending laterally along the nozzle and relative to the patterning region of the reflective patterning device, and wherein the supplying the gas comprises supplying the gas through the plurality of outlet openings.

19. The method of claim 13, wherein the gas supply nozzle comprises an outlet opening extending laterally along the nozzle and relative to the patterning region of the reflective patterning device, and wherein the supplying the gas comprises supplying the gas through the outlet opening.

20. The method of claim 13, wherein the supplying the gas comprises supplying the gas over substantially the entire patterning region of the reflective patterning device.

21. The method of claim 13, wherein the supplying the gas comprises supplying the gas over an area that is larger than the patterning region of the reflective patterning device.

22. A lithographic apparatus comprising:
a support structure constructed and arranged to support a reflective patterning device, the reflective patterning device configured to impart an illumination beam from an illumination system with a pattern to form a patterned radiation beam;
a projection system constructed and arranged to receive the patterned radiation beam reflected by the reflective patterning device and configured to project the patterned radiation beam onto a substrate;
a frame, the support structure being movable relative to the frame; and
a plurality of gas supply nozzles coupled to the frame and constructed and arranged to supply gas therefrom, the plurality of gas supply nozzles protruding into a gap between the projection system and the support structure and/or a gap between the illumination system and the support structure and the plurality of gas supply nozzles arranged such that at least one of the plurality of gas supply nozzles is on one side of a patterning region of the reflective patterning device and at least another of the plurality of gas supply nozzles is on an opposite side of the patterning region, wherein at least one of the plurality of gas supply nozzles is configured to be moved relative to the projection system and/or the illumination system.

23. The lithographic apparatus of claim 22, further comprising a patterning device masking blade spaced from the patterning device and in the path of the illumination beam, such that a space is defined between the masking blade and the patterning device, and
wherein the plurality of gas supply nozzles are configured to supply gas to the space.

24. The lithographic apparatus of claim 23, wherein the plurality of gas supply nozzles is above the masking blade.

25. The lithographic apparatus of claim 22, wherein each nozzle of the plurality of gas supply nozzles is constructed and arranged to supply gas over at least the entire patterning region of the reflective patterning device.

26. The lithographic apparatus of claim 22, wherein each nozzle of the plurality of gas supply nozzles comprises a lateral dimension that is larger than the patterning region of the reflective patterning device.

27. The lithographic apparatus of claim 22, wherein each of the plurality of gas supply nozzles are uncoupled from the support structure such that the support structure is constructed and arranged to move relative to the plurality of gas supply nozzles.

28. The lithographic apparatus of claim 22, wherein at least one of the gas supply nozzles comprises a plurality of outlet openings extending laterally along the nozzle and relative to the patterning region of the reflective patterning device.

29. The lithographic apparatus of claim 22, wherein at least one of the gas supply nozzles comprises an elongate outlet opening extending laterally along the nozzle and relative to the patterning region of the reflective patterning device.

30. The lithographic apparatus of claim 22, wherein the illumination beam is a radiation beam at an EUV wavelength.

* * * * *